Nov. 8, 1960 G. GORDON, JR 2,959,716

NOISE INSENSITIVE, SIGNAL DETECTING AND RELAY OPERATING APPARATUS

Filed July 28, 1958

INVENTOR.
Gerald Gordon, Jr.

BY [signature]

ATTORNEY.

United States Patent Office 2,959,716

Patented Nov. 8, 1960

2,959,716

NOISE INSENSITIVE, SIGNAL DETECTING AND RELAY OPERATING APPARATUS

Gerald Gordon, Jr., Mission, Kans., assignor to Raymond Rodick and Vernon Rodick, both of Sedalia, Mo.

Filed July 28, 1958, Ser. No. 751,546

17 Claims. (Cl. 317—148.5)

Figure 1:
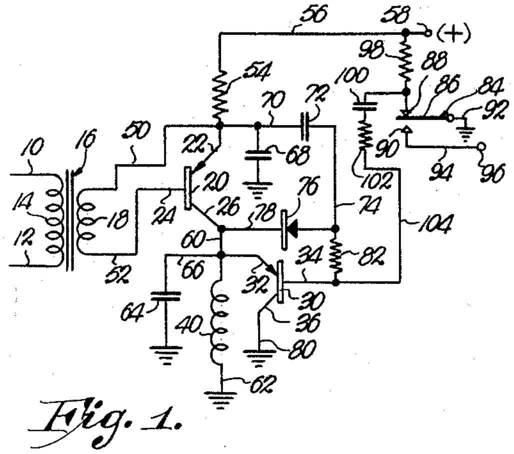

This invention relates to improved electrical circuitry for controlling the operation of a relay or the like responsive to a radio frequency input applied to the circuitry. In particular, the invention involves improvements in such circuitry by which the latter may be rendered reliably responsive to pure continuous wave radio frequency carrier signals of proper frequency, but nonresponsive to signals of such frequency which are amplitude modulated to any appreciable extent, as would be the case with noise signals of such frequency.

Previously known types of radio frequency signal responsive relay controlling circuitry have all been subject to various undesirable limitations and disadvantages, among which may be noted unreliability through response to noise signals, undue complexity resulting in high initial and maintenance costs, inability to operate responsive to an unmodulated carrier signal so that the associated control signal generator must be unnecessarily complex in order to provide the required modulation upon or other special characteristics in the control signal, etc.

Accordingly, it is the primary object of this invention to provide improved circuitry of the class in question for overcoming the above-mentioned and other limitations and disadvantages of conventional circuitry of the same general class.

Another important object of the invention is to provide such improved circuitry which is adapted both to respond reliably to unmodulated radio frequency control signals of proper frequency even when of very low level and to remain nonresponsive to noise or other spurious signals even when of the proper frequency and of relatively high level.

Another important object of the invention is to provide such improved circuitry utilizing a device in shunt with the relay coil or the like whose energization is to be controlled, the conductive properties of which device (or the impedance thereacross) are subject to be electrically controlled by the input signals applied to the circuitry.

Another important object of the invention is to provide such improved circuitry in which the input signal is applied to a second device effectively in series with the relay coil or the like whose energization is to be controlled in such manner as to control the conductive properties of (or the impedance across) such series device, and in which circuit connections responsive to the presence of amplitude modulation components in the applied input signal are provided from such series device to the shunting device for controlling the conductive properties (or impedance) of the latter, whereby the series device may be rendered sufficiently conductive for energization of the relay coil in response to the presence of a substantially unmodulated carrier of proper frequency in the applied input when the shunt device is relatively nonconductive, but the shunt device may be rendered sufficiently conductive to prevent energization of the relay coil by the presence of an appreciably modulated signal in the applied input.

Another important object of the invention is to provide such improved circuitry in which power and size requirements may be minimized by virtue of the special adaptability of the circuitry for the employment of transistor and diode rectifier, semiconductor devices.

Another important object of the invention is to provide such improved circuitry in which is included means for preventing electrical noise disturbance transients created momentarily upon initial energization of the relay by initial energization of electrical equipment controlled by the relay from resulting deenergization of the relay.

Still other important objects of the invention will be made clear or become apparent as the following description of a currently preferred embodiment, and certain modified embodiments to be disclosed for further illustrating the principles of the invention, progresses.

Although not necessarily so restricted, it will be evident to those skilled in the art that the improved circuitry provided by this invention will often be incorporated into more extensive radio wave receiving circuitry including a number of signal amplifying stages preceding the relay control circuitry of this invention. It will be further apparent that such receiving equipment can be employed for countless purposes distinguishable in essence only by the nature of the electrical apparatus to be controlled by (or in the place of) the relay. It should be understood, therefore, that all of those various applications which those skilled in the art will perceive for the invention are contemplated as being within the intent and scope of the latter.

For purposes of illustrating the principles of the invention, however, an exemplary application of the invention may be cited as in the receiving equipment employed in an improved type of garage door controlling system. In such system, the householder's automobile may be equipped with means for generating and transmitting an unmodulated, continuous wave, radio frequency carrier signal of predetermined frequency (for example, on one of several frequency channels between 50 and 100 kilocycles), whenever an operating button in the automobile is pressed. The receiving equipment portion of such system at the garage will then respond to the transmission of such unmodulated carried signal to energize a relay coil for operating a switch to energize a motor through a power circuit for the latter to raise or lower the householder's garage door. Although neither the generating and transmitting portion of such a system, the remainder of the receiving equipment or the motor, or other ultimately controlled apparatus, constitute per se any real part of the present invention and will not be described in any detail, it may be helpful to an understanding of the invention if the latter is considered in the light of its exemplary applicability to such a system. In such connection, therefore, it will not be inappropriate to note that prior radio controlled garage door opening systems have proven relatively impractical because the limitations and disadvantages thereof mentioned above, and particularly the unreliabil'ty of same due to susceptibility to uncontrolled operation of the switching relay in response to noise transients or other spurious signals.

In the accompanying drawing:

Fig. 1 is a schematic diagram of a currently preferred embodiment of the novel circuitry contemplated by the invention; and Figs. 2, 3, 4 and 5 are schematic diagrams of modified embodiments of such circuitry intended to further illustrate the scope of applicability of the principles of the invention.

Referring to Fig. 1, the numerals 10 and 12 designate signal input leads which normally will be, but need not, be coming from the last of a number of preceding signal amplifying stages including frequency selective means for attenuating signals of frequencies other than the selected frequency channel of operation. Leads 10 and 12 are coupled with the primary 14 of a coupling transformer 16 having a secondary 18.

The circuitry of Fig. 1 utilizes a pair of PNP junction transistors 20 and 30, hereinafter sometimes respectively referred to as the series transistor 20 and the shunt transistor 30 by virtue of their general relationship in the circuitry to a relay operating coil 40 whose energization is to be controlled. Transistors 20 and 30 may be, for example, of types 2N243 or 2N319.

The secondary 18 of signal input transformer 16 is coupled between the emitter 22 and the base 24 of the series transistor 20 by conductive means 50 and 52 respectively. The emitter 22 of series transistor 20 is also coupled through a resistance 54 (which may be of the order of 1,000 ohms), and conductive means 56 with a source of positive operating voltage (which may be of the order of 18 volts direct current with respect to ground) represented by a positive terminal 58.

The collector 26 of series transistor 20 is coupled with one end of the relay operating coil 40 by conductive means 60, the opposite end of the coil 40 being grounded as at 62. A relatively large capacitor 64 (which may be of the order of 25 microfarads), is coupled to ground in parallel with the relay operating coil 40 by conductive means 66.

The emitter 22 of the series transistor 20 is also coupled with the collector 26 thereof through conductive means 70, a capacitor 72 (which may be of the order of 5 microfarads), conductive means 74, a rectifier diode 76 (which may be, for example, of type IN65 or IN90), and conductive means 78.

The emitter 32 of shunt transistor 30 is coupled with the ungrounded end of relay operating coil 40, and through conductive means 60, with the collector 26 of the series transistor 20. The collector 36 of the shunt transistor is grounded as at 80. The base 34 of the shunt transistor 30 is coupled through a resistance 82 (which may be of the order of 10,000 ohms) with the conductive means 74 between the capacitor 72 and the diode rectifier 76 in the above-mentioned circuit between the emitter 22 and the collector 26 of the series transistor 20.

A relay switch 84 operably associated with the relay coil for operation by the latter includes a pole piece 86 normally in engagement with a stationary contact 88 adapted to be shifted into engagement with another stationary contact 90 whenever the coil 40 is energized. The pole piece 84 is grounded as at 92. The normally open contact 90 is coupled by conductive means 94 with a terminal 96 to which may be connected an external circuit (not shown), whose completion by grounding through the relay switch 82 is the ultimate control function to be performed by the apparatus. A resistance 98 is coupled between the positive terminal 58 and the normally closed contact 88 of relay switch 84. The contact 88 is also coupled through a capacitor 100 (which may be of the order of 5 microfarads), a resistance 102 (which may be of the order of 10,000 ohms), and conductive means 104 with the conductive means 34 at a point separated from the emitter of series transistor 20 by the resistance 82 and by the capacitor 72, from the collector 26 of series transistor 20 by the resistance 82 and by the diode rectifier 76, and the base 34 of the shunt transistor 30.

It may be noted that the relay coil 40 should be selected in view of the particular type of series transistor 20 and shunt transistor 30 that are to be used and may, with the types of transistors mentioned above, have a series resistance of the order of 1,500 ohms.

In considering the operation of the circuitry shown in Fig. 1, assume first that no input signal is being applied to the leads 10 and 12. In this condition, and since there is no bias being applied to either the base 24 of series transistor 20 or the base 34 of shunt transistor 30, both of such transistors 20 and 30 will be in cut-off, nonconductive condition with a relatively high impedance presented between the emitter 22 and the collector 26 of series transistor 20, as well as a similarly high impedance between the emitter 32 and the collector 36 of the shunt transistor 30. Accordingly, it will be clear that insufficient current will be passed through the series circuit traceable from ground at 62 through the relay operating coil 40, the conductive means 60, the collector 26 and emitter 22 of series transistor 20, the resistance 54 and the conductive means 56 to positive terminal 58 for the relay operating coil to be effectively energized. The relay switch 84 associated with the relay coil 40 will, therefore, be in the condition illustrated with the grounding pole piece 84 out of engagement with the external circuit controlling, normally open contact 90 thereof.

Next, consider the situation when a substantially pure, unmodulated, continuous wave carrier signal is applied to the input leads 10 and 12. Such applied signal will be imposed by the coupling transformer secondary 18 across the base 24 and the emitter 22 of the transistor 20, which it will be understood, functions as a detector. During the negative half cycles of such applied carrier signal, the series transistor 20 will be rendered conductive, and the effective impedance between the emitter 22 and the collector 26 will be markedly decreased so that sufficient current may flow through the relay operating coil in the previously traced series circuit between ground 62 and positive terminal 58 for the pole piece 86 of relay switch 84 to be attracted to the normally open external circuit controlling contact 90 of switch 84.

It is significant to note that as the series transistor 20 commences to conduct, the voltage level at the emitter 22 thereof will tend to fall rapidly because of the small time constant presented between resistance 54 and the by-pass condenser 68. As will be apparent, the by-pass condenser 68 is of a value to by-pass to ground any signal components of the carrier frequency, but is of insufficient capacity to by-pass signal components of lower modulation frequencies. As the voltage level at the emitter 22 of the series transistor 20 falls upon imposition of a carrier signal upon the transistor 20, a transient is created to charge the capacitor 72 through the circuit traceable from emitter 22 through conductive means 70, capacitor 72, conductive means 74, resistance 82, the base 34 of shunt transistor 30, the emitter 32 of transistor 30, and conductive means 60 to the collector 26 of series transistor 20. It will be noted that the valuation of capacitor 72 and resistance 82 are so chosen that the time constant for charging of the capacitor 72 will be relatively small (for example, of the order of around ¼ of a second, taking into account the current amplification occurring in the transistor 30).

During the time that the capacitor 72 is charging, which applies a negative transient to the base 34 of shunt transistor 30, the impedance between emitter 32 and collector 36 of shunt transistor 30 becomes relatively low so as to shunt the relay operating coil 40 with a very low impedance preventing (or more correctly, delaying), the effective energization and operation of the relay coil 40 in the manner referred to above. It will be observed, however, that the negative bias applied to the base 34 of the shunt transistor 30 as the series transistor 20 commences to conduct and the emitter potential at the latter falls, is developed by the application of the mentioned transient to the diode 76 and subsists only so long as the transient itself. Accordingly, assuming that the carrier signal applied to the input leads 10 and 12 is of some finite duration, such as would be the case when an intended control carrier signal is intentionally applied, the mentioned transient will die out after the capacitor 72 has been charged during the time interval required for such charging, whereupon the negative potential applied to the base 34 of the shunt transistor 30 will be terminated and the shunt transistor 30 will return to its cut-off, nonconductive state in which a high impedance between the emitter 32 and collector 36 thereof is presented across the relay operating coil 40. Since series transistor 20 will be continuing to conduct heavily during the continued application of the carrier input signal thereo, it will be clear that the coil 40 will be energized to operate switch 84 in the manner first described after the last-mentioned short delay effected by the action of shunt transistor 30 responsive to the transient created by the fall of potential at emitter 22 when the series transistor 20 first commenced conducting.

In order to appreciate the significance of the action of the shunt transistor 30 referred to above, let it now be assumed that, instead of an unmodulated carrier signal being applied to leads 10 and 12, a noise transient of the proper frequency is applied thereto. Since such noise pulses are of short duration, it will probably already be clear to those skilled in the art that the transient created when the series transistor 20 first commences to conduct in response thereto will operate in substantially the fashion just described to develop a bias at the base 34 of shunt transistor 30 which will cause the latter to change from a cut-off state to a saturation conductive state shunting the relay coil 40 and preventing the effective energization of the latter during the period that such noise transient ensues and maintains the series transistor 20 in its conductive state. It may be noted that the diode 76 permits rapid discharging, or "reverse charging" of the capacitor 72 upon the decay of the transient, which will be attended by a return of the potential level at the emitter 22 of the series transistor 20 to its normally high value. Obviously, at the same time, the bias is being removed from the base 34 of shunt transistor 30 so that the latter is ceasing to conduct.

In the case of application to the input leads 10 and 12 of a carrier signal of proper frequency but which bears amplitude modulation components, such modulation components will not be fully by-passed by the capacitor 68 and will serve to produce charging of the capaictor 72 with resultant development of bias on the shunt transistor 30 and heavy conduction of current by the latter, in substantially the same manner as above explained in respect of isolated transients or modulation type signals created by noise applied to the input leads 10 and 12. With a continuously modulated carrier being applied to the leads 10 and 12 the capacitor 72 and the diode 76 may be considered as acting as a rectifier circuit for the modulation component to develop the negative bias which is applied to the base 34 of the shunt transistor 30. It may be noted that a resistance could conceivably be substituted for the diode 76 with, however, some substantial decrease in efficiency of the action described.

It may be observed that the ability of the circuitry contemplated by the invention to distinguish between desired control inputs of unmodulated carrier from their undesired noise transients or modulated carriers may be traced to the detecting action of the transistor 20 provided with the carrier frequency by-pass capacitor 68 and the fact that a substantial current will flow in the circuit between the emitter 22 and the collector 26 of transistor 20 through capacitor 72 and diode 76 to develop a bias across the latter which may be applied to the shunt transistor 30 to render the latter conductive only when relatively low frequency transients or modulation components are presented. The relatively large capacitor 64 shunted across the relay operating coil 40 serves to smooth out ripple which might occur in the current applied to the relay coil 40 and also provides a further short delay which is helpful in preventing undesired energization of the coil 50 by transients of large amplitude.

It will be clear that the described circuitry is capable of responding to desired, unmodulated control input signals of even relatively low level, while being adapted to remain nonresponsive to undesired transient or modulated input signals of even very large magnitude. In the latter connection, it should be pointed out, however, that any amplifying stages which precede the input leads 10 and 12 in the handling of signals should be so designed as not to clip or remove the modulation components from modulated or noise signals of large amplitude.

A further feature of the circuitry is that same is specially protected against any tendency for the energization of relay coil 40 to be undesirably terminated after initial operation of the switch 84 by strong electrical transients which may be generated by the initiation of operation of an electrical machine, such as a motor, which may be controlled from the terminal 96. This is accomplished through the breaking of the grounding connection between the pole piece 86 of switch 84 and the normally closed contact 88 thereof when the relay coil 40 is energized and the switch 84 operated. When the grounding connection to contact 88 is broken, a sizeable positive transient is applied to the base 34 of shunt transistor 30 through the circuit traceable from positive terminal 58 through resistance 98, capacitor 100, resistance 102, conductive means 104 and resistance 82 to the base 34 of the transistor 30. The application of such positive bias to the base 34 of shunt transistor 30 will overcome any relatively smaller negative bias which would otherwise be applied thereto from the rectifying action of the diode 76 in response to the imposition of the mentioned transients occurring upon starting of a motor or the like to the input leads 10 and 12 in addition to the desired unmodulated input control signal.

It is thus believed apparent that the preferred form of the invention is ideally adapted to accomplish all of the above-mentioned and other objects claimed for the invention.

The remaining figures show variations or modifications of the above described, preferred circuitry which has been explained in detail. In view of such foregoing explanation, it is believed that the operation of the variations shown in Figs. 2 through 5 inclusive, will be obvious to those skilled in the art from a consideration of the disclosed structure itself and the somewhat more brief comments regarding same to be set forth hereinafter.

Figure 2:
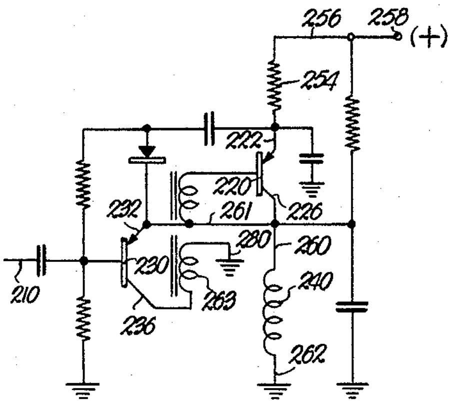

The modified embodiment of Fig. 2 also uses a pair of PNP transistors 220 and 230. The circuitry is so arranged, however, as to provide reflexed action with the transistor 220 being used as a detector, while the transistor 230 serves both as a signal amplifier and relay shunting device for the operating coil 240 of a relay or the like. In Fig. 2, the input lead is designated 210 and will be understood as working against ground. The series circuit for energizing the relay coil 240 responsive to an unmodulated carrier input may be traced from positive terminal 258 through conductive means 256, a resistance 254, the emitter 222 of transistor 220, the collector 226 of transistor 220, conductive means 260 and the relay coil 240 to ground as at 262. The shunting circuit for the coil 240 may be traced from the conductor 260 through a conductor 261, the emitter 232 of transistor 230, the collector 236 of transistor 230, and an inductance 263, provided for reflex purposes, to ground as at 280. The relay switch, which it will be understood is operably associated with the coil 240, is not shown.

Figure 3:
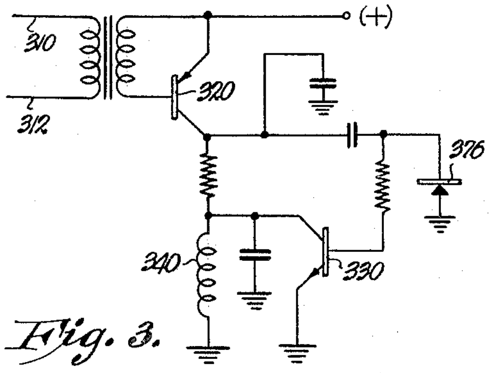

The embodiment of Fig. 3 illustrates the manner in which a PNP type transistor may be used for the series transistor 320 while a NPN type transistor is used for the shunt transistor 330. The input leads are shown at 310 and 312 and the relay operating coil is illustrated at 340. As will be apparent to those skilled in the art, the major change from the circuitry of Fig. 1 is in the orientation of a diode rectifier 376 and the associated connections for providing the required polarity of bias upon the shunt transistor 330 in response to transients or modulation.

Figure 4:
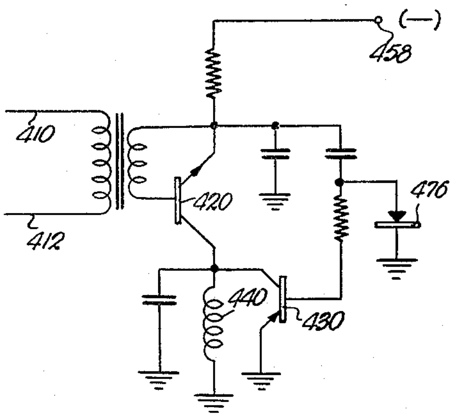

Similarly, the circuitry of Fig. 4 illustrates the manner in which an NPN type transistor can be used for the series transistor 420, while a PNP type transistor may be used for the shunt transistor 430. The input signal leads are shown at 410 and 412, and it will be noted that a negative voltage supply, rather than a positive one, is provided at the terminal 458, with the diode 476 again restored to substantially the same orientation relative to the shunt transistor 430 as employed in the circuitry of Fig. 1. The relay operating coil is illustrated at 440.

Figure 5:
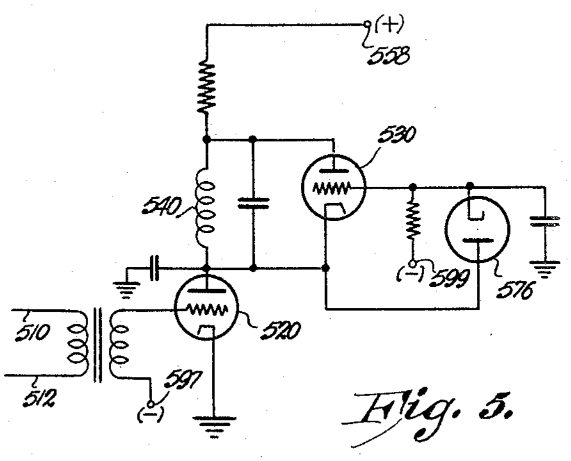

In Fig. 5, there is shown a vacuum tube counterpart of the circuitry with a triode vacuum tube 520 being employed in place of the series transistor 20 of Fig. 1, a triode vacuum tube 530 being employed in the place of the shunt transistor 30 utilized in the circuitry of Fig. 1, and a vacuum tube diode 576 being utilized in place of the semiconductor device 76 employed in the circuitry of Fig. 1. The input leads are indicated at 510 and 512 and the relay operating coil is shown at 540. Negative bias for the grids of the tubes 520 and 530 may be applied as at 597 and 599, while the plate operating positive potential is driven from terminal 558. As will be apparent to those skilled in the art, the bias at 597 normally renders the series tube 520 in cut-off condition. Upon application of an unmodulated carrier signal to the leads 510 and 512, the tube 520 will be driven to conduction resulting in the passage of current through the relay operating coil 540 to energize the latter. Transients or modulation components in the applying signal will be rectified by the diode 576 to overcome the bias from source 599 upon the grid of the shunt tube 530 to thereby change the latter from its cut-off to a heavily conducting state for shunting a low impedance across the relay operating coil 540.

It is now believed that those skilled in the art will fully understand and appreciate both the nature and advantages of the invention. It will be equally manifest to such persons, however, that still further minor modifications or variations of circuitry may be utilized without departing from the true spirit, intention and accomplishment of the invention. Accordingly, it is to be understood that the invention shall be deemed limited only by the scope of the claims that follow.

Having thus described the invention, what is claimed as new and desired to be secured by Letters Patent is:

1. In electrical apparatus, the combination of: signal input means adapted to have applied thereto externally generated electrical signals of various types; electrically operable means whose energization is to be controlled responsive to application to said input means of electrical signals of one only of said types thereof; a first device having at least three electrical terminations, the series impedance between a pair of said terminations being subject to substantial decrease in response to application to a third of said terminations of an electrical signal of said one type; a second device having at least three electrical terminations, the series impedance between a pair of said last-mentioned terminations being subject to substantial decrease in response to application to a third of said last-mentioned terminations of an electrical potential of predetermined characteristics; first circuit means coupling said input means with said third termination of said first device; second circuit means adapted for coupling said pair of terminations of said first device in series with said electrically operable means and a source of electrical power; third circuit means coupling said pair of terminations of said second device in shunt with said electrically operable means; electrical structure coupled with at least one of said pair of terminations of said first device for developing a potential of said predetermined characteristics responsive to application to said input means of electrical signals of other than said one type thereof; and fourth circuit means coupling said structure with said third termination of said second device.

2. In electrical apparatus as set forth in claim 1, wherein said input means has a pair of electrical sides respectively coupled with said third termination and one of said pair of terminations of said first device.

3. In electrical apparatus as set forth in claim 1, wherein said electrically operable means comprises a relay coil having a relay switch for controlling an external electrical circuit operably coupled therewith.

4. In apparatus as set forth in claim 1, wherein said structure comprises an electrical circuit having a by-pass capacitor coupled to ground for eliminating from said last-mentioned circuit signal components corresponding to said one type of signal.

5. In apparatus as set forth in claim 1, wherein said structure comprises an electrical circuit having a capacitor and a rectifier in series therewith, said capacitor being chargeable by signal components in said last-mentioned circuit of other than said one type thereof.

6. In electrical apparatus as set forth in claim 1, wherein is provided electrical parts for developing an electrical potential of characteristics substantially different from said predetermined characteristics for a finite period of time following initiation of operation thereof; a switch operably coupled with said electrically operable means for actuation by the latter upon energization thereof and electrically coupled with said electrical parts for initiating operation of the latter; and further circuit means coupling said electrical parts with said third termination of said second device.

7. In apparatus as set forth in claim 1, wherein said first device comprises a transistor.

8. In apparatus as set forth in claim 1, wherein said second device comprises a transistor.

9. In apparatus as set forth in claim 1, wherein both said first and second devices are transistors.

10. In apparatus as set forth in claim 1, wherein said devices are both vacuum tubes.

11. In electrical apparatus, the combination of: signal input means having a pair of electrical sides and adapted to have applied thereto externally generated, modulated and unmodulated, radio frequency signals; a first PNP transistor having an emitter, a collector and a base; a second PNP transistor having an emitter, a collector and a base; a relay having an operating coil whose energization is to be controlled responsive to application to said input means of unmodulated radio frequency signals only; circuit means coupling said input means with the emitter and the base of said first transistor; a source of positive potential; circuit means coupling the emitter of said first transistor with said positive potential source; circuit means coupling the collector of said first transistor to ground through said operating coil; a capacitor; a rectifier; circuit means coupling said capacitor and said rectifier in series with each other and between the emitter and the collector of said first transistor; circuit means coupling the base of said second transistor with the last previously mentioned circuit means between said capacitor and said rectifier; circuit means coupling the emitter of said second transistor with the collector of said first transistor; and circuit means coupling the collector of said second transistor with ground.

12. In apparatus as set forth in claim 11, wherein is provided a by-pass condenser coupling the emitter of said first transistor to ground.

13. In apparatus as set forth in claim 11, wherein is provided a normally closed relay switch operably associated with said relay coil for opening of said switch when said coil is energized; circuit means coupling one side of said switch with ground; a resistance coupling the other side of said switch with said positive potential source; and circuit means including in series therewith a further capacitor and a further resistor coupling said other side of said switch with the base of said second transistor.

14. In electrical apparatus, the combination of: signal input means having a pair of electrical sides and adapted to have applied thereto externally generated, modulated and unmodulated, radio frequency signals; a first PNP transistor having an emitter, a collector and a base; a second PNP transistor having an emitter, a collector and a base; a relay having an operating coil whose energization is to be controlled responsive to application to said input means of unmodulated radio frequency signals only; circuit means coupling one side of said input means to the base of said second transistor; a reflexing transformer having a pair of windings; circuit means coupling one winding of said transformer between the other side of said input means and the collector of said second transistor; a source of positive potential; circuit means coupling the emitter of said second transistor with the collector of said first transistor and said source of positive potential; means coupling the other winding of said transformer between the emitter of said second transistor and the base of said first transistor; circuit means coupling the emitter of said first transistor with said source of positive potential; circuit means coupling said operating coil between the collector of said first transistor and ground; a capacitor; a rectifier; circuit means coupling said capacitor and said rectifier in series circuit between the emitter of said first transistor and the emitter of said second transistor; circuit means coupling the base of said second transistor with the last previously mentioned circuit means between said capacitor and said rectifier in the latter; and a radio frequency by-pass condenser coupled between the emitter of said first transistor and ground.

15. In electrical apparatus, the combination of: signal input means having a pair of electrical sides and adapted to have applied thereto externally generated, modulated and unmodulated, radio frequency signals; a PNP transistor having an emitter, a collector and a base; a NPN transistor having an emitter, a collector and a base; a relay having an operating coil whose energization is to be controlled responsive to application to said input means of unmodulated radio frequency signals only; circuit means coupling said input means with the emitter and the base of said PNP transistor; a source of positive potential; circuit means coupling the emitter of said PNP transistor with said positive potential source; circuit means coupling the collector of said PNP transistor to ground through said operating coil; a capacitor; a rectifier; circuit means coupling said capacitance and said rectifier in series between the collector of said PNP transistor and ground; circuit means coupling the base of said NPN transistor with said last previously mentioned circuit between the capacitor and the rectifier therein; circuit means coupling the emitter of said NPN transistor to ground; circuit means coupling the collector of said NPN transistor to the collector of said PNP transistor; and a by-pass condenser coupled between the emitter of said PNP transistor and ground.

16. In electrical apparatus, the combination of: signal input means having a pair of electrical sides and adapted to have applied thereto externally generated, modulated and unmodulated, radio frequency signals; an NPN transistor having an emitter, a collector and a base; a PNP transistor having an emitter, a collector and a base; a relay having an operating coil whose energization is to be controlled responsive to application to said input means of unmodulated radio frequency signals only; circuit means coupling said input means with the emitter and the base of said NPN transistor; a source of negative potential; circuit means coupling the emitter of said NPN transistor with said negative potential source; circuit means coupling the collector of said first transistor to ground through said operating coil; a capacitor; a rectifier; circuit means coupling said capacitor and said rectifier in series between the emitter of said NPN transistor and ground; circuit means coupling the base of said PNP transistor with the last previously mentioned circuit means between said capacitor and said rectifier therein; circuit means coupling the emitter of said PNP transistor to ground; circuit means coupling the collector of said PNP transistor to the collector of said NPN transistor; and a by-pass condenser coupled between the emitter of said NPN transistor and ground.

17. In electrical apparatus, the combination of: signal input means having a pair of electrical sides and adapted to have applied thereto externally generated, modulated and unmodulated, radio frequency signals; a first vacuum tube having a cathode, a grid and a plate; a second vacuum tube having a cathode, a grid, and a plate; a relay having an operating coil whose energization is to be controlled responsive to application to said input means of unmodulated radio frequency signals only; circuit means coupling said input means with the cathode and the grid of said first vacuum tube; a source of positive potential; circuit means coupling the cathode and the plate of said first vacuum tube and said operating coil in series between said positive potential source and ground; circuit means coupling the plate of said first vacuum tube with the cathode of said second vacuum tube; a rectifier; a capacitor; circuit means coupling said rectifier and said capacitor in series between the plate of said first vacuum tube and ground; circuit means coupling the grid of said second vacuum tube with the last previously mentioned circuit between said rectifier and said capacitor therein; circuit means coupling the plate of said second vacuum tube with said positive potential source; and a by-pass condenser coupled between the plate of said first vacuum tube and ground.

References Cited in the file of this patent

UNITED STATES PATENTS

| | | |
|---|---|---|
| 2,580,148 | Wirkler | Dec. 25, 1951 |
| 2,724,074 | Welker | Nov. 15, 1955 |